(12) United States Patent
Lambert et al.

(10) Patent No.: US 12,171,054 B2
(45) Date of Patent: Dec. 17, 2024

(54) EUV LIGHT SOURCE WITH A BEAM POSITIONING DEVICE

(71) Applicant: TRUMPF Lasersystems for Semiconductor Manufacturing GmbH, Ditzingen (DE)

(72) Inventors: Martin Lambert, Korb (DE); Boris Regaard, Stuttgart (DE); Tolga Ergin, Bietigheim-Bissingen (DE); Oliver Schlosser, Filderstadt (DE)

(73) Assignee: TRUMPF Lasersystems for Semiconductor Manufacturing SE, Ditzingen (DE)

( * ) Notice: Subject to any disclaimer, the term of this patent is extended or adjusted under 35 U.S.C. 154(b) by 0 days.

(21) Appl. No.: 18/644,458

(22) Filed: Apr. 24, 2024

(65) Prior Publication Data
US 2024/0357726 A1 Oct. 24, 2024

Related U.S. Application Data

(63) Continuation of application No. PCT/EP2021/079514, filed on Oct. 25, 2021.

(51) Int. Cl.
*H05G 2/00* (2006.01)
*G03F 7/00* (2006.01)

(52) U.S. Cl.
CPC ......... *H05G 2/008* (2013.01); *G03F 7/70033* (2013.01)

(58) Field of Classification Search
CPC .............................. H05G 2/008; G03F 7/70033
See application file for complete search history.

(56) References Cited

U.S. PATENT DOCUMENTS

| | | | |
|---|---|---|---|
| 10,773,339 B2 | 9/2020 | Sonner et al. | |
| 2007/0119835 A1 | 5/2007 | Nomaru | |
| 2010/0117009 A1 | 5/2010 | Moriya et al. | |
| 2014/0217073 A1 | 8/2014 | Armbruster et al. | |
| 2016/0195729 A1 | 7/2016 | Lambert | |
| 2019/0001442 A1 | 1/2019 | Unrath et al. | |
| 2019/0329350 A1 | 10/2019 | Unrath et al. | |

FOREIGN PATENT DOCUMENTS

| | | |
|---|---|---|
| DE | 102012111090 A1 | 3/2014 |
| DE | 102015109984 A1 | 12/2016 |
| WO | WO 2015036025 A1 | 3/2015 |

*Primary Examiner* — Nicole M Ippolito
*Assistant Examiner* — Hanway Chang
(74) *Attorney, Agent, or Firm* — LEYDIG, VOIT & MAYER, LTD.

(57) ABSTRACT

An extreme ultraviolet (EUV) light source includes a providing device for providing a target material, a pulsed laser source for emitting a pulsed laser beam, and a beam guidance device for supplying the pulsed laser beam from the pulsed laser source into a radiation generation chamber and for focused irradiation of the target material with the pulsed laser beam. The target material is configured to emit EUV radiation on account of the irradiation. The beam guidance device includes a beam positioning device comprising four mirrors as two mirror pairs for positioning the pulsed laser beam. Each of the four mirrors is rotatable about exactly one axis of rotation. The axes of rotation of the two mirrors of a first mirror pair are aligned along a first spatial direction. The axes of rotation of the two mirrors of a second mirror pair are aligned along a second spatial direction.

15 Claims, 3 Drawing Sheets

EUV LIGHT SOURCE WITH A BEAM POSITIONING DEVICE

CROSS REFERENCE TO RELATED APPLICATIONS

This application is a continuation of International Application No. PCT/EP2021/079514 (WO 2023/072362 A1), filed on Oct. 25, 2021, and claims benefit to International Application No. PCT/EP2021/079514, filed on Oct. 25, 2021. The aforementioned application is hereby incorporated by reference herein.

FIELD

Embodiments of the present invention relate to an extreme ultraviolet (EUV) light source.

BACKGROUND

An EUV light source is a radiation source which serves for emitting EUV radiation. EUV radiation refers to electromagnetic radiation with a wavelength of between approx. 5 nm and approx. 30 nm. EUV radiation finds application in the semiconductor industry, in particular. Compared with lithography apparatuses that are currently widely used and are operated with wavelengths in the UV wavelength range, the use of EUV radiation for microlithographic fabrication allows the reliable production of components with significantly smaller structure sizes and thus results in a corresponding increase in performance.

The EUV light source mentioned above is suitable for the generation of EUV radiation by means of an LPP (laser-produced plasma) process. The target material, which is typically a metal, in particular tin, is provided preferably in droplet form by means of the providing device. A respective droplet is then irradiated within the radiation generation chamber, for example a vacuum chamber, with one or more laser pulses of the at least one laser beam. In the case of a plurality of laser pulses, these comprise, for example, one, two or possibly more than two so-called prepulses and one so-called main pulse. The prepulse or the prepulses serve(s) to prepare the droplet for the irradiation by the main pulse, in particular to heat up the droplet, to expand it, to vaporize it and/or to produce a plasma. The subsequent irradiation of a respective droplet by a respective main pulse serves to convert the target material to the plasma state, as a result of which the emission of EUV radiation occurs.

Accordingly, the at least one pulsed laser beam may be, for example, at least one prepulse laser beam or a main pulse laser beam. The at least one pulsed laser source is then, for example, at least one prepulse laser source or a main pulse laser source. For example, a CO2 laser can be used as a prepulse laser source, and a solid-state laser can be used as a main pulse laser source.

The beam guidance device serves to supply the at least one pulsed laser beam from the at least one pulsed laser source into the radiation generation chamber. For this purpose, the beam guidance device typically comprises a multiplicity of optical elements, in particular a multiplicity of reflective optical elements. If a plurality of pulsed laser beams are involved, their beam paths may be separate from one another or coincide at least in sections. If a plurality of prepulse laser beams are used, these can at least partially be collinear; however, this is not necessarily the case. For the focused irradiation of the target material, the beam guidance device further comprises at least one optical element with which the at least one pulsed laser beam is focused.

A beam guidance device for an EUV radiation generating device is disclosed in WO 2015/036025 A1. In that document, a paraboloid mirror is used to superpose two laser beams that are incident on a first and on a second area of the paraboloid mirror. In the beam path of the second laser beam, a telescopic arrangement with two lenses is arranged, the distance between which is settable to change a focus position of the second laser beam in a direction perpendicular to the movement direction of the target material. Tilting deflection mirrors can be used to change the focus position of the second laser beam along the movement direction of the target material.

SUMMARY

Embodiments of the present invention provide an extreme ultraviolet (EUV) light source. The EUV light source includes a providing device for providing a target material, at least one pulsed laser source for emitting at least one pulsed laser beam, and a beam guidance device for supplying the at least one pulsed laser beam from the at least one pulsed laser source into a radiation generation chamber and for focused irradiation of the target material with the at least one pulsed laser beam within the radiation generation chamber. The target material is configured to emit EUV radiation on account of the irradiation. The beam guidance device includes at least one beam positioning device comprising four mirrors as two mirror pairs for positioning the at least one pulsed laser beam. Each of the four mirrors is rotatable about exactly one axis of rotation. The axes of rotation of the two mirrors of a first mirror pair are aligned along a first spatial direction. The axes of rotation of the two mirrors of a second mirror pair are aligned along a second spatial direction.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
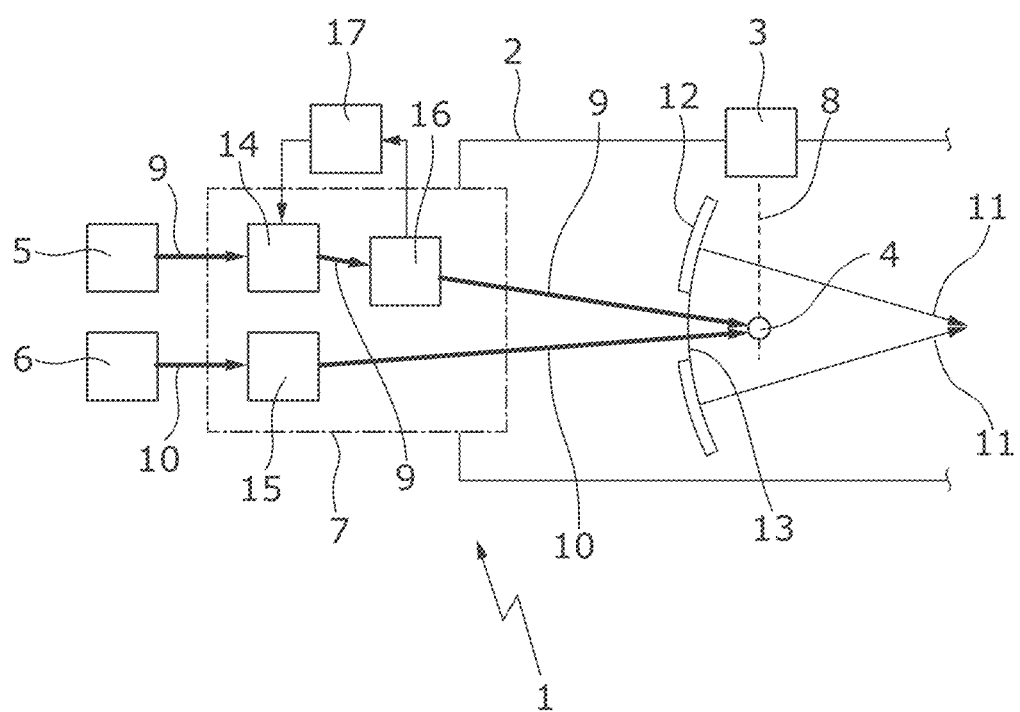
FIG. 1 shows a schematic illustration of an EUV light source having a beam guidance device, comprising a first beam positioning device for setting the spatial pose of a first pulsed laser beam and a second beam positioning device for setting the spatial pose of a second pulsed laser beam, according to some embodiments.

Embodiments of the invention provide an EUV light source, which allows precise positioning of the at least one focused pulsed laser beam on the target material and setting of the angle of incidence and is preferably characterized by a high dynamic with simultaneous high actuation resolution.

According to embodiments of the present invention, an EUV light source includes a providing device for providing a target material, at least one pulsed laser source for emitting at least one pulsed laser beam, a beam guidance device for supplying the at least one pulsed laser beam from the at least one pulsed laser source into a radiation generation chamber and for focused irradiation of the target material with the at least one pulsed laser beam within the radiation generation chamber, wherein the target material is designed to emit EUV radiation as a result of the irradiation. The beam guidance device for setting the spatial pose of the at least one pulsed laser beam has at least one beam positioning device comprising four mirrors in the form of two mirror pairs, wherein the four mirrors are rotatable each about exactly one axis of rotation and the axes of rotation of the two mirrors of the first mirror pair are aligned along a first spatial direction and the axes of rotation of the two mirrors of the second mirror pair are aligned along a second spatial direction.

For the purposes of this application, the spatial pose of a laser beam means the combination of the position and the beam direction of the laser beam. Assuming that the laser beam intersects a specified plane, the position of the laser beam can be described via the point of intersection with this plane. This results altogether in four degrees of freedom for the spatial position: two location coordinates for describing the point of intersection of the laser beam with the plane and two angles for describing the beam direction.

The four mirrors may be designed such that a complete rotation or only rotation within a limited angular range is possible. For example, a separate drive for each mirror can be provided to rotate the mirrors. For the purposes of this application, a mirror pair is understood to mean a total of two mirrors.

The spatial pose of the at least one pulsed laser beam can be selectively set by means of the at least one beam positioning device. Thus, the target material, for example a tin droplet, can be impinged upon with great accuracy, typically an accuracy of one micrometer or less, and at the same time the angle of incidence can be set with an accuracy of the order of microradians. This ultimately leads to a high efficiency of the EUV light source.

If the target material is irradiated with a plurality of pulsed laser beams, the beam guidance device may have a plurality of beam positioning devices. Each of the beam positioning devices can be used in that case to set the spatial pose of in each case one of the pulsed laser beams. A beam positioning device can also be used to set the spatial poses of a plurality of the pulsed laser beams. In the latter case, however, the spatial poses cannot be set independently of one another.

By simultaneously adjusting the position and beam direction, the pivot point of the laser beam can also be placed at any point in the propagation direction of the pulsed laser beam. In other words, by adjusting the mirrors, the at least one laser beam can be rotated about any point (in the propagation direction of the pulsed laser beam). In addition to the application in EUV light sources, this is also fundamentally of great importance for other optical structures, for example in order to ensure good imaging quality and smaller apertures for the optical elements.

An important parameter of the beam positioning device is the actuation resolution of the spatial pose of the pulsed laser beam achieved thereby. Here it is useful to consider the actuation resolution for the beam direction and for the position of the pulsed laser beam separately. The actuation resolution for the beam direction is specified by the angular resolution, i.e. the resolution of the rotation of the mirrors, and thus depends on the drive used. The actuation resolution for the position of the pulsed laser beam perpendicular to the first spatial direction is determined by the angular resolution and the distance between the two mirrors of the first mirror pair. The actuation resolution for the position of the pulsed laser beam perpendicular to the second spatial direction is derived accordingly from the angular resolution and the distance between the two mirrors of the second mirror pair.

Compared to apparatuses which, for setting the beam pose of a laser beam, have two mirrors which can be rotated about two axes, which are settable in motorized or manual fashion, and, due to the two-axis design, allow only slow adjustment processes with a cutoff frequency in the range of a few hertz, the beam positioning device enables an adjustment that is faster by orders of magnitude and thus a higher dynamic. In the case of mirrors that can be rotated about only one axis of rotation, a higher angular resolution can also typically be achieved, which results in a correspondingly higher actuation resolution of the spatial pose of the pulsed laser beam.

Apparatuses that allow the beam angle of a laser beam to be adjusted by mirrors that can be rotated about exactly one axis of rotation are also used in laser material processing, for example in laser marking or remote laser welding. The laser beam is tilted by a rotation of the mirrors, at which the—usually collimated—laser beam is reflected, by means of a suitable drive. In order to realize any tilting motion in two axes, two of these mirrors are arranged one after the other. Focusing on the typically flat processing plane is achieved using F-theta lenses. A telecentric F-theta lens is typically used to achieve a constant angle of incidence on the processing plane. However, such apparatuses usually do not allow the spatial pose of the laser beam to be set, but are usually limited to two (angular) degrees of freedom.

An exception is DE 10 2015 109 984 A1, in which a scanner head for laser material processing with a beam pose system for setting the laser beam pose is described, which in one embodiment comprises four rotatable mirrors, which are in each case rotatable about only a single respective axis of rotation. Two of the four mirrors are oriented along a first spatial direction, a third one of the four mirrors is oriented along a second spatial direction, and a fourth one of the four mirrors is oriented along a third spatial direction, with all three spatial directions being perpendicular to one another. In an alternative embodiment, the beam pose system for setting the laser beam pose has two double-axis mirrors that can each be tilted about two axes of rotation.

In one embodiment, the first spatial direction and the second spatial direction are perpendicular to each other. This perpendicular arrangement allows the two mirror pairs to be decoupled for setting the spatial pose.

In a further embodiment, the two mirrors of the first mirror pair follow each other directly in the beam path. This maximizes the resolution for setting the position of the at least one pulsed laser beam perpendicular to the first spatial direction at a given resolution of the rotation of the mirrors of the first mirror pair.

In a further development of this embodiment, a distance between the two mirrors of the first mirror pair is less than 150 mm.

In a further embodiment, the two mirrors of the second mirror pair immediately follow each other in the beam path. This maximizes the resolution for setting the position of the at least one pulsed laser beam perpendicular to the second spatial direction at a given resolution of the rotation of the mirrors of the second mirror pair.

In a further development of this embodiment, a distance between the two mirrors of the second mirror pair is less than 150 mm.

In a further embodiment, the first mirror of the second mirror pair is arranged in the beam path upstream of the first mirror pair and the second mirror of the second mirror pair is arranged in the beam path downstream of the first mirror pair. In this case, the first mirror in the beam path, i.e. the first mirror of the second mirror pair, and the second mirror in the beam path, which is one of the mirrors of the first mirror pair, may have smaller apertures, which allows a greater dynamic in the actuation angle. The third mirror in the beam path, which is the other mirror of the first mirror pair, and the fourth mirror in the beam path, i.e. the second mirror of the second mirror pair, require larger apertures. Due to the larger distance between the two mirrors of the second mirror pair, a smaller rotational movement of the mirrors is necessary for adjusting the position of the pulsed laser beam perpendicular to the second spatial direction. Although this results in a lower resolution for setting the position of the pulsed laser beam perpendicular to the second spatial direction, it also results in a greater actuation dynamic, which may be advantageous in certain cases.

In principle, the alignment of the axes of rotation of the four mirrors may also deviate from the alignments described here. For example, the axes of rotation of the first and third mirrors in the beam path can be aligned along a first spatial direction, and the axes of rotation of the second and fourth mirrors in the beam path can be aligned along a second spatial direction, which is perpendicular to the first spatial direction. However, deviating alignments sometimes require additional mirrors to correct the spatial direction or lead to a dependency between the actuation axes.

In a further embodiment, the beam positioning device has at least one galvanometer drive for the rotation of one of the four mirrors about its respective axis of rotation. With galvanometer drives, a dynamic setting of the spatial pose of the pulsed laser beam, in particular a setting in the frequency range of more than 1 kHz, can be achieved. Galvanometer drives also allow a high angular resolution, i.e. a high resolution for the rotation of the mirrors. This results in a high actuation resolution for the spatial pose of the pulsed laser beam, in particular a resolution of the beam direction according to an angle of less than 1 µrad and a resolution of the position corresponding to a spatial distance of 1 µm or less.

Instead of galvanometer drives, for example, closed-loop controlled brushless motors, optionally with a gear ratio between the motor and the mirror, can also be used to rotate the mirrors. So-called voice coil drives can also be used. The latter, however, typically have a smaller actuation range and do not allow full rotation.

In a further embodiment, the EUV light source comprises at least one beam position detection device for detecting the spatial pose of the at least one pulsed laser beam and at least one closed-loop control device for controlling the spatial pose of the at least one pulsed laser beam by means of the at least one beam positioning device. The beam position detection device may, for example, comprise at least one position-sensitive sensor (e.g. a quadrant sensor) and/or at least one position-sensitive camera. By arranging a position-sensitive sensor or a position-sensitive camera in the near field of the pulsed laser beam, the position can be detected, by arrangement in the far field, the angle can be detected. By means of the closed-loop control device, the spatial pose of the pulsed laser beam can be adjusted to a desired target value. For example, the angle of incidence of the pulsed laser beam and the position on the target material can be kept constant. The high dynamic allows the correction of vibrations and other dynamic interfering processes. This applies in particular in the case of the use of galvanometer drives, which make it possible in the first place to correct higher-frequency disturbances that occur regularly in the EUV light sources mentioned in the introductory part. These requirements cannot be met with two-axis angle-adjustable mirrors or laterally displaceable lenses.

In a further embodiment, a deflection angle of the pulsed laser beam at at least one of the four mirrors lies in an angular range of between 30° and 90°, preferably between 60° and 90°. When a laser beam is reflected on a mirror, the deflection angle denotes the angle between the incident and the reflected laser beam. It corresponds to twice the angle of incidence. The deflection angle of the pulsed laser beam at the four mirrors is basically arbitrary. However, a deflection angle of less than or equal to 90° is advantageous to keep the dimensions of the mirrors small and to optimize the efficiency or the polarization dependence of coatings of the mirrors.

In a further embodiment, a front side of at least one of the four mirrors has a highly reflective coating for the pulsed laser beam. A highly reflective coating on the front side results in less radiation loss and thus higher efficiency of the EUV light source. The reflectance of the coated front side of the mirror should be as high as possible, for example at more than 98%, preferably at more than 99%. The highly reflective coating may, for example, be a dielectric multi-layer coating which has a maximum reflection at the wavelength of the pulsed laser beam. The design of such a highly reflective coating is familiar to a person skilled in the art.

In a further embodiment, a back side of at least one of the four mirrors has an anti-reflective coating for the at least one pulsed laser beam. By means of such an anti-reflective coating, unwanted double reflections can be avoided and heating up of the mirror during operation of the EUV light source can be reduced. The anti-reflective coating may likewise be a dielectric multi-layer coating that has minimal reflection at the wavelength of the pulsed laser beam.

In a further embodiment, a substrate of at least one of the four mirrors has a low absorption for the at least one pulsed laser beam. The material can be, for example, a silicate glass, in particular quartz glass ("fused silica"). This reduces or avoids heating up of at least one of the four mirrors during operation of the EUV light source.

In a further embodiment, the beam guidance device is designed to supply the pulsed laser beam to the beam positioning device in collimated or divergent form. Supplying it in the collimated form is usually preferable.

Exemplary embodiments are illustrated in the schematic drawing and are explained in the following description.

FIG. 1 shows an EUV light source 1, which comprises a radiation generation chamber 2, a providing device 3 for providing a target material 4, a first pulsed laser source 5, a second pulsed laser source 6, and a beam guidance device 7.

The target material 4 is tin provided in the form of droplets 4 by the providing device 3 within the radiation generation chamber 2. The droplets 4 emerging from the providing device 3 move within the radiation generation chamber 2 along a specified movement path 8 running approximately rectilinearly. In principle, however, the target material 4 can also be a different material, for example a different metal. Moreover, the providing by means of the providing device 3 need not be effected in droplet form.

The first pulsed laser source 5 emits a first pulsed laser beam 9; the second pulsed laser source 6 emits a second pulsed laser beam 10. The laser pulses of the first pulsed laser beam 9 and the second pulsed laser beam 10 may be, for example, prepulses or main pulses. The pulsed laser sources 5, 6 here are for example, but not necessarily, CO2 lasers.

By means of the beam guidance device 7, the first pulsed laser beam 9 and the second pulsed laser beam 10 are supplied into the radiation generation chamber 2. Further, the target material 4 is irradiated with the pulsed laser beams 9, 10 in a focused manner using the beam guidance device 7. For these purposes, the beam guidance device 7 may have a plurality of transmissive and/or reflective optical elements (not shown here).

As a result of the irradiation with one or more laser pulses of the first pulsed laser beam 9 and one or more laser pulses of the second pulsed laser beam 10, the target material 4 is transferred to the plasma state and the emission of EUV radiation 11 occurs, which is collected by means of a collector mirror 12 arranged in the radiation generation chamber 2. The collector mirror 12 has an opening 13 through which the pulsed laser beams 9, 10 pass.

Furthermore, the beam guidance device 7 comprises a first beam positioning device 14 for setting the spatial pose of the first pulsed laser beam 9 and a second beam positioning device 15 for setting the spatial pose of the second pulsed laser beam 10. The two beam positioning devices 14.15 can be identical or different in design.

Finally, the EUV light source 1 additionally comprises a beam position detection device 16 for detecting the spatial pose of the first pulsed laser beam 9 and a closed-loop control device 17 for controlling the spatial pose of the first pulsed laser beam 9 via the first beam positioning device 14. The beam position detection device 16 is part of the beam guidance device 7 in the example shown. However, this is not necessarily the case. The beam position detection device 16 comprises, for example, but not necessarily, two position-sensitive sensors (not shown here), e.g. a quadrant sensor and/or at least one position-sensitive camera. The closed-loop control device 17 may be a conventional controller, for example a PID controller.

In deviation from the example shown, the EUV light source may also comprise only one pulsed laser source or more than two pulsed laser sources. In addition, the target material 4 can be irradiated with only one or with more than two pulsed laser beams. Further, the beam guidance device 7 may also have only one or more than two beam positioning devices. When using two or more than two pulsed laser beams, one beam positioning device may be provided for all or only for some or for one of the pulsed laser beams. The spatial poses of more than one pulsed laser beam can also be set via a beam positioning device. The beam guidance device also does not have to have a beam positioning device for each of the pulsed laser beams. Finally, beam position detection devices and corresponding closed-loop control devices may be provided for all or only for some or only one of the beam positioning devices.

Figure 2A:
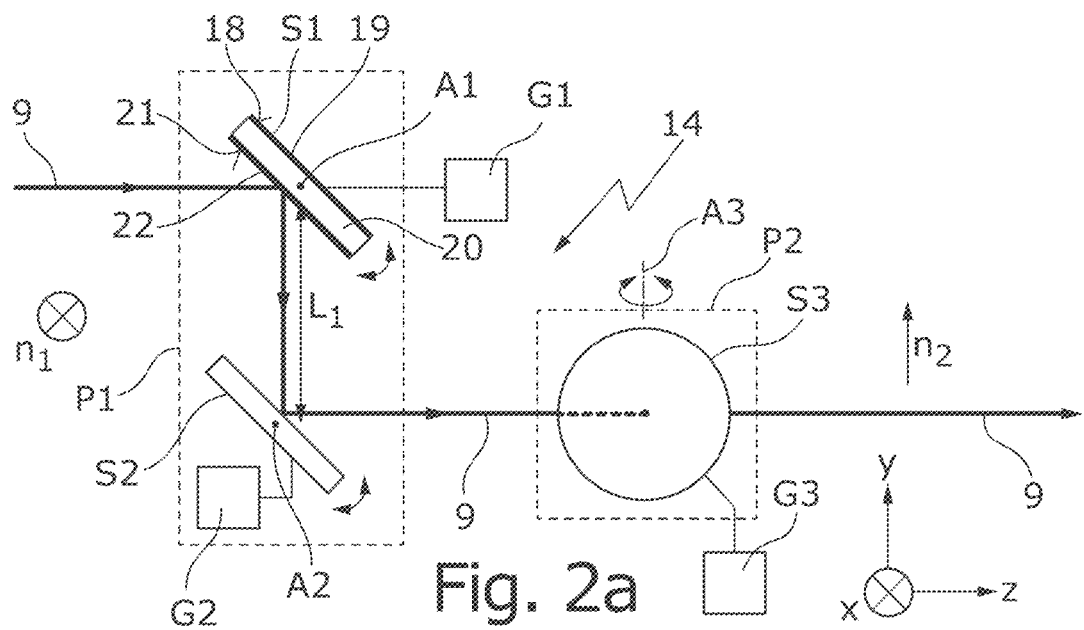
FIG. 2a, FIG. 2b and FIG. 2c show schematic detailed views of the first beam positioning device of the EUV light source shown in FIG. 1, which has four mirrors in the form of two mirror pairs, according to some embodiments.

FIGS. 2a,b,c show schematic detailed views of the first beam positioning device 14 of the EUV light source 1 shown in FIG. 1, which serves to set the spatial pose of the first pulsed laser beam 9 and comprises four mirrors S1, S2, S3, S4 in the form of two mirror pairs P1, P2. The four mirrors S1, S2, S3, S4 can be rotated each about exactly one axis of rotation A1, A2, A3, A4. The axes of rotation A1, A2 of the two mirrors S1, S2 of the first mirror pair P1 are aligned along a first spatial direction n1. The axes of rotation A3, A4 of the two mirrors S3, S4 of the second mirror pair P2 are aligned along a second spatial direction n2. One galvanometer drive G1, G2, G3, G4 is used in each case for each of the four mirrors S1, S2, S3, S4 to rotate the four mirrors S1, S2, S3, S4. In deviation herefrom, at least one of the four mirrors S1, S2, S3, S4 can also be rotated using a different drive.

To simplify the description, a Cartesian coordinate system with three coordinate axes x,y,z is shown in each case. The first spatial direction n1 is parallel to the x-axis here; the second spatial direction n2 is parallel to the y-axis. The first spatial direction n1 and the second spatial direction n2 are thus perpendicular to each other in the example shown. However, the first spatial direction n1 and the second spatial direction n2 do not necessarily have to be perpendicular to each other.

In the example shown in FIGS. 2a,b, c, the two mirrors S1, S2 of the first mirror pair P1 immediately follow each other in the beam path. In addition, the two mirrors S3, S4 of the second mirror pair P2 immediately follow each other in the beam path. The first mirror S1 and the second mirror S2 of the first mirror pair P1 are the first and second mirrors, respectively, in the beam path of the first pulsed laser beam 9. The first mirror S3 and the second mirror S4 of the second mirror pair P2 are the third and fourth mirrors, respectively, in the beam path of the first pulsed laser beam 9.

Figure 2B:
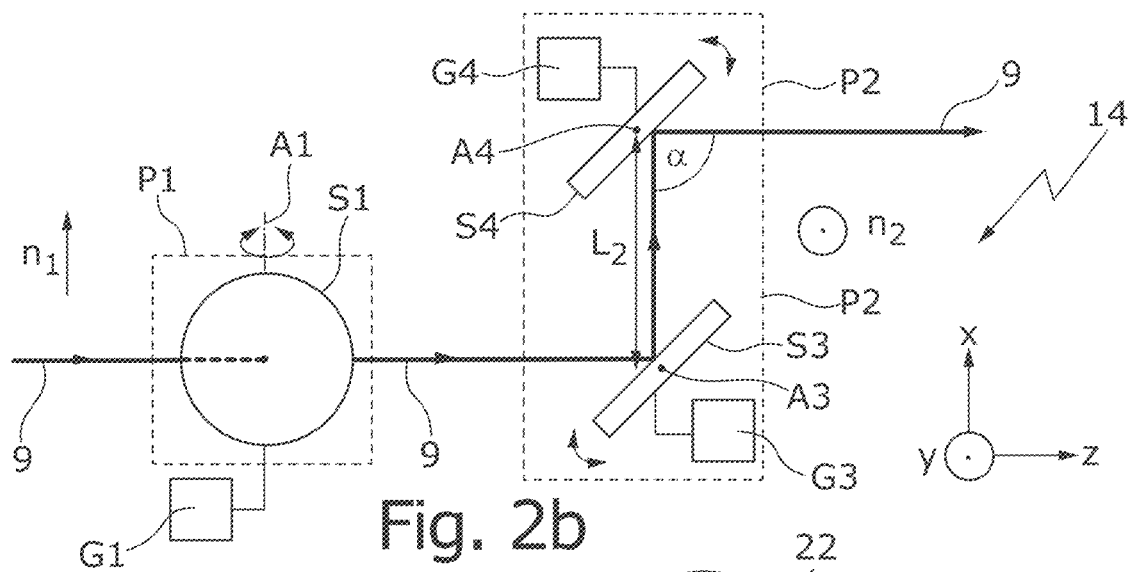
Figure 2C:
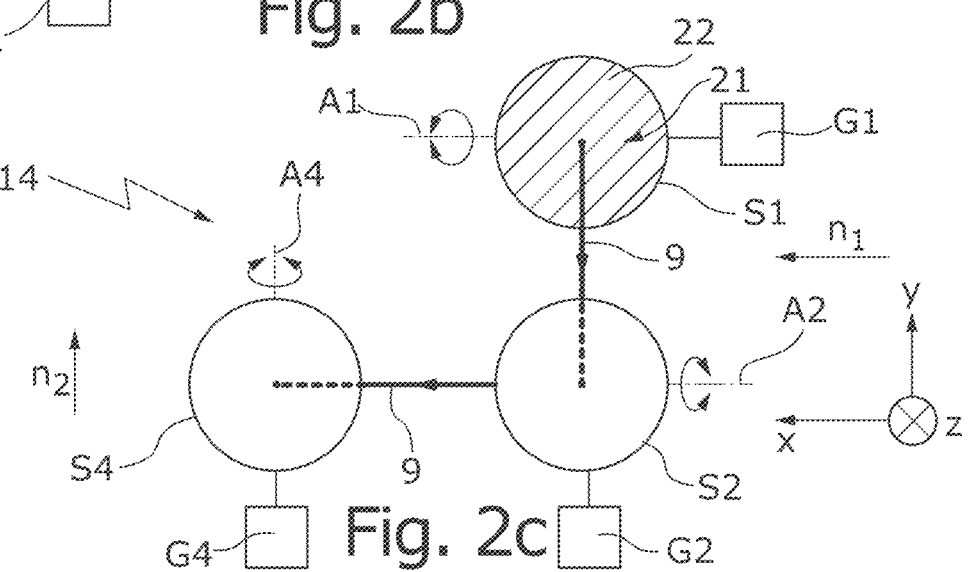

In FIGS. 2a,b,c, in each case one of the four mirrors S1, S2, S3, S4 is obscured by another of the four mirrors S1, S2, S3, S4: In FIG. 2a, the second mirror S4 of the second mirror pair P2 is obscured by the first mirror S3 of the second mirror pair P2. In FIG. 2b, the second mirror S2 of the first mirror pair P1 is obscured by the first mirror S1 of the first mirror pair P1. Finally, in FIG. 2c, the first mirror S3 of the second mirror pair P2 is obscured by the second mirror S2 of the first mirror pair P1.

The pulsed laser beam 9 is also partially obscured. Where the pulsed laser beam 9 runs directly behind one of the mirrors S1, S2, S3, S4, it is shown as a dashed line. The two mirror pairs P1, P2 are also only identified in FIG. 2a and FIG. 2b, since they partially overlap in FIG. 2c.

In FIG. 2a, the distance L1 between the two mirrors S1, S2 of the first mirror pair P1 is also drawn, and in FIG. 2b the distance L2 between the two mirrors S3, S4 of the second mirror pair P2 is drawn. The distances L1, L2 in the example shown are 100 mm. However, the distances L1, L2 can also be larger or smaller and differ from each other. However, the distances L1, L2 are preferably less than 150 mm.

As can be seen from FIG. 2a, the back side 18 of the first mirror S1 of the first mirror pair P1 has an anti-reflective coating 19 for the pulsed laser beam 9. Furthermore, the substrate 20 of the first mirror S1 of the first mirror pair P1 has a low absorption for the pulsed laser beam 9. In the example shown, the material of the substrate 20 is quartz glass, but it may also be another material, for example SiC, wherein SiC is not transmissive at a wavelength of 1 μm, however. As is further evident from the FIGS. 2a and 2c, the front side 21 of the first mirror S1 of the first mirror pair P1 additionally has a reflective coating 22 for the pulsed laser beam 9. In the example shown, the other three mirrors S2, S3, S4 also have a reflective coating on their respective front sides and have on their respective back sides an anti-reflective coating for the pulsed laser beam 9, the illustration of which was omitted in FIGS. 2a,b,c for simplification reasons. In the example shown, the material of the respective substrate 20 also has a low absorption in the other three mirrors S2, S3, S4.

In the example shown, the deflection angle α of the pulsed laser beam 9 at all four mirrors S1, S2, S3, S4 is approx. 90°. The deflection angle α is drawn here in FIG. 2b at the second mirror S4 of the second mirror pair P2. However, the deflection angle α can also be greater or less than 90°. The deflection angle α preferably lies in an angular range of between 30° and 90°, preferably between 60° and 90°.

Figure 3A:
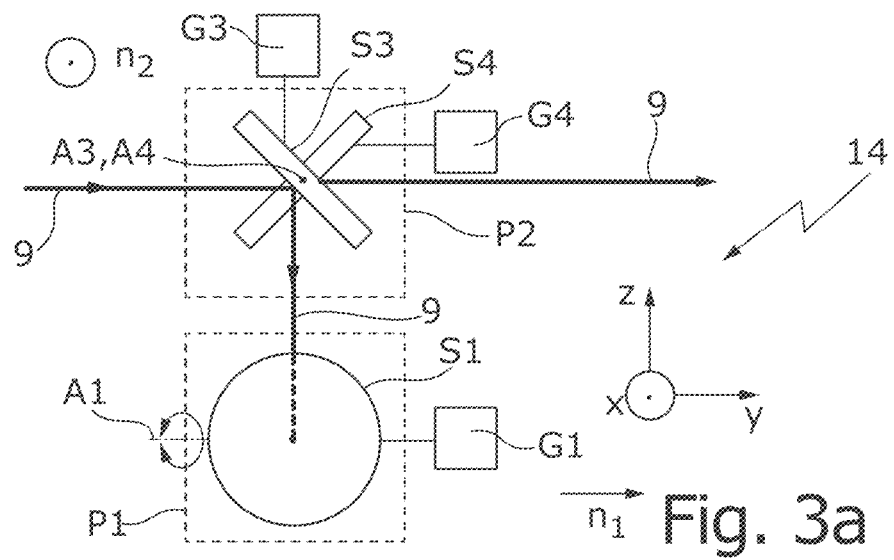
FIG. 3a, FIG. 3b and FIG. 3c show schematic detail views of a variant of the beam positioning device shown in FIG. 3a, FIG. 3b, FIG. 3c, according to some embodiments.

In FIGS. 3a,b,c, an alternative variant of the beam positioning device 14 shown in FIGS. 2a,b,c is schematically shown in three detailed views. In deviation from FIGS. 2a,b,c, the first spatial direction n1 is here parallel to the propagation direction of the pulsed laser beam 9 entering the beam positioning device 14, which corresponds to the y-axis, and the second spatial direction n2 is parallel to the x-axis. Furthermore, in FIGS. 3a,b,c, the first mirror S3 of the second mirror pair P2 is arranged in the beam path upstream of the first mirror pair P1 and the second mirror S4 of the second mirror pair P2 is arranged in the beam path downstream of the first mirror pair P1.

Figure 3B:
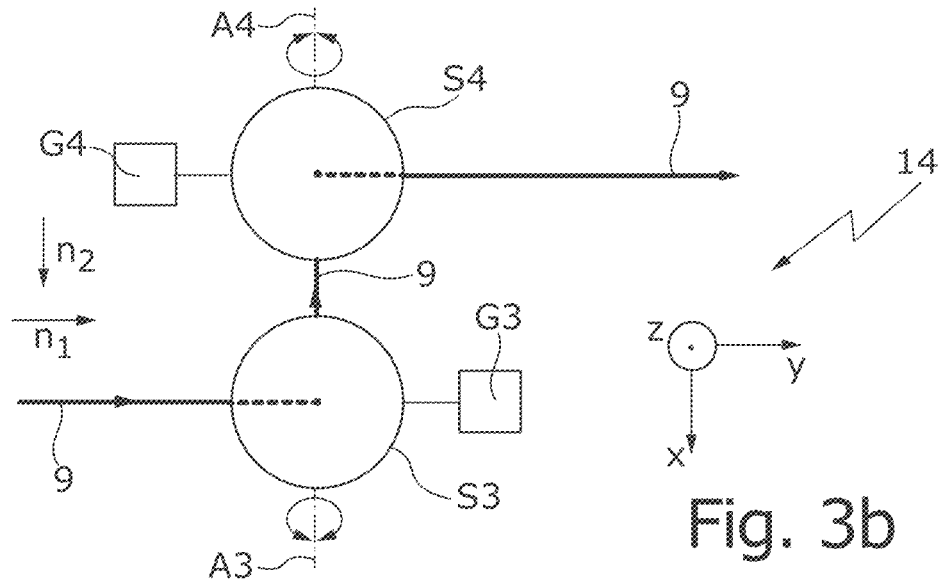
Figure 3C:
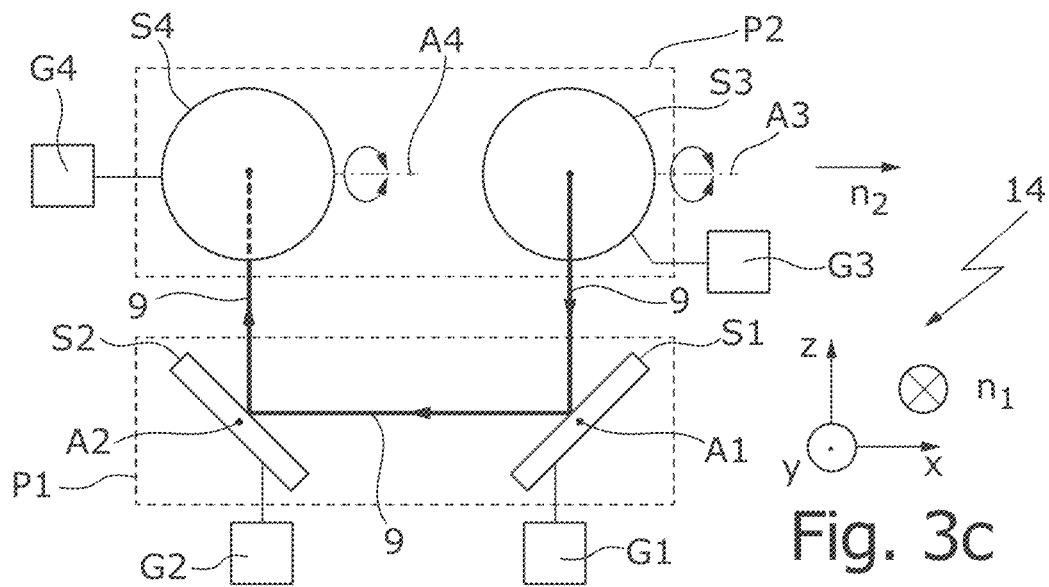

The first mirror S1 and the second mirror S2 of the first mirror pair P1 are the second and third mirrors, respectively, in the beam path of the pulsed laser beam 9. The first mirror S3 and the second mirror S4 of the second mirror pair P2 are the first and fourth mirrors, respectively, in the beam path of the pulsed laser beam 9. In FIG. 3a, the second mirror S4 of the second mirror pair P2 is partially obscured by the first mirror S3 of the second mirror pair P2, and the second mirror S2 of the first mirror pair P1 is obscured completely by the first mirror S1 of the first mirror pair P1. In FIG. 3b, the two mirrors S1, S2 of the first mirror pair P1 are further completely obscured by the two mirrors S3, S4 of the second mirror pair P2. The two mirror pairs P1, P2 are also only identified only in FIG. 3a and FIG. 3c, since they overlap in FIG. 3b.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An extreme ultraviolet (EUV) light source comprising:
   a providing device for providing a target material,
   at least one pulsed laser source for emitting at least one pulsed laser beam,
   a beam guidance device for supplying the at least one pulsed laser beam from the at least one pulsed laser source into a radiation generation chamber and for focused irradiation of the target material with the at least one pulsed laser beam within the radiation generation chamber,
   the target material being configured to emit EUV radiation on account of the irradiation,
   wherein
   the beam guidance device comprises at least one beam positioning device comprising four mirrors as two mirror pairs for positioning the at least one pulsed laser beam, wherein each of the four mirrors is rotatable about exactly one axis of rotation, the axes of rotation of the two mirrors of a first mirror pair are aligned along a first spatial direction, and the axes of rotation of the two mirrors of a second mirror pair are aligned along a second spatial direction.

2. The EUV light source as claimed in claim 1, wherein the first spatial direction and the second spatial direction are perpendicular to each other.

3. The EUV light source as claimed in claim 1, wherein the two mirrors of the first mirror pair immediately follow one another in a beam path.

4. The EUV light source as claimed in claim 3, wherein a distance between the two mirrors of the first mirror pair is less than 150 mm.

5. The EUV light source as claimed in claim 1, wherein the two mirrors of the second mirror pair immediately follow one another in a beam path.

6. The EUV light source as claimed in claim 5, wherein a distance between the two mirrors of the second mirror pair is less than 150 mm.

7. The EUV light source as claimed in claim 3, wherein a first mirror of the second mirror pair is arranged in the beam path upstream of the first mirror pair and a second mirror of the second mirror pair is arranged in the beam path downstream of the first mirror pair.

8. The EUV light source as claimed in claim 1, wherein the beam positioning device comprises at least one galvanometer drive for the rotation of one of the four mirrors about the respective axis of rotation.

9. The EUV light source as claimed in claim 1, further comprising:
   at least one beam position detection device for detecting a spatial pose of the at least one pulsed laser beam, and
   at least one closed-loop controller for controlling the spatial pose of the at least one pulsed laser beam by using the at least one beam positioning device.

10. The EUV light source as claimed in claim 1, wherein a deflection angle of the pulsed laser beam at at least one of the four mirrors lies in an angular range of between 30° and 90°.

11. The EUV light source as claimed in claim 1, wherein a deflection angle of the pulsed laser beam at at least one of the four mirrors lies in an angular range of between 60° and 90°.

12. The EUV light source as claimed in claim 1, wherein a front side of at least one of the four mirrors has a reflective coating for the pulsed laser beam.

13. The EUV light source as claimed in claim 1, wherein a back side of at least one of the four mirrors has an anti-reflective coating for the at least one pulsed laser beam.

14. The EUV light source as claimed in claim 1, wherein a substrate of at least one of the four mirrors has a low absorption for the at least one pulsed laser beam.

15. The EUV light source as claimed in claim 1, wherein the beam guidance device is configured to supply the pulsed laser beam to the beam positioning device in a collimated or divergent form.

* * * * *